United States Patent
Son et al.

(10) Patent No.: US 7,609,178 B2
(45) Date of Patent: Oct. 27, 2009

(54) RECONFIGURABLE TACTILE SENSOR INPUT DEVICE

(75) Inventors: Jae S. Son, Rancho Palos Verdes, CA (US); David Ables, Venice, CA (US); Gordon Dobie, Los Angeles, CA (US)

(73) Assignee: Pressure Profile Systems, Inc., Los Angeles, CA (US)

( * ) Notice: Subject to any disclaimer, the term of this patent is extended or adjusted under 35 U.S.C. 154(b) by 542 days.

(21) Appl. No.: 11/407,535

(22) Filed: Apr. 20, 2006

(65) Prior Publication Data

US 2007/0257821 A1 Nov. 8, 2007

(51) Int. Cl.
*H03M 11/00* (2006.01)
(52) U.S. Cl. ............... 341/33; 341/20; 341/22; 345/158; 345/168; 345/173; 200/600; 361/287
(58) Field of Classification Search ............ 341/20, 341/22, 33; 345/168, 173, 158; 200/600; 361/287
See application file for complete search history.

(56) References Cited

U.S. PATENT DOCUMENTS

| | | | |
|---|---|---|---|
| 4,202,041 A | | 5/1980 | Kaplow |
| 4,373,122 A | * | 2/1983 | Frame .................. 200/600 |
| 4,526,043 A | | 7/1985 | Boie |
| 4,733,222 A | * | 3/1988 | Evans ................... 341/33 |
| 4,736,191 A | | 4/1988 | Matzke |
| 4,910,504 A | * | 3/1990 | Eriksson .............. 345/174 |
| 4,975,676 A | * | 12/1990 | Greenhalgh ........... 338/114 |
| 5,225,959 A | * | 7/1993 | Stearns ................ 361/283.1 |
| 5,463,388 A | | 10/1995 | Boie |
| 5,479,528 A | | 12/1995 | Speeter |
| 5,608,599 A | | 3/1997 | Goldman |
| 5,867,111 A | * | 2/1999 | Caldwell et al. ............ 341/33 |
| 5,877,695 A | | 3/1999 | Kubes |
| 5,942,733 A | | 8/1999 | Allen |
| 6,035,180 A | | 3/2000 | Kubes |
| 6,188,391 B1 | | 2/2001 | Seely |
| 6,723,933 B2 | * | 4/2004 | Haag et al. ............. 200/61.42 |
| 6,824,321 B2 | | 11/2004 | Ward |
| 6,888,536 B2 | | 5/2005 | Westerman |
| 6,888,537 B2 | | 5/2005 | Benson |
| 6,943,705 B1 | * | 9/2005 | Bolender et al. ............ 341/33 |
| 7,391,861 B2 | * | 6/2008 | Levy ..................... 379/368 |
| 2006/0152885 A1 | | 7/2006 | Hewit |
| 2007/0229464 A1 | | 10/2007 | Hotelling |

* cited by examiner

*Primary Examiner*—Albert K Wong
(74) *Attorney, Agent, or Firm*—Boris Leschinsky

(57) ABSTRACT

A reconfigurable tactile input device includes a first rigid electrode layer, a compressible dielectric structure, and a second flexible electrode layer forming together a tactile sensor with appropriate electrode connection means to a control means. The control means may include a mixed-signal IC mounted next to the input device in a compact package and capable of measuring capacitance in real time. The dielectric structure may include a matrix of compressible geometric elements with voids therebetween optionally vented to atmosphere, making the entire assembly thin and facilitating its use for mobile phones and other small, portable electronic devices. Some embodiments provide the user wit tactile feedback upon compression of the electrodes. An optional flexible display may be mounted over the input device to indicate the present configuration to the user.

30 Claims, 6 Drawing Sheets

A  B  C  D

RECONFIGURABLE TACTILE SENSOR INPUT DEVICE

BACKGROUND OF THE INVENTION

The present invention relates generally to reconfigurable input devices. More particularly, the input device of the present invention utilizes tactile sensor technology while at the same time allowing the device to change its function depending on the needs of a particular application. In one particularly advantageous embodiment, the tactile input device is capable of measuring contact location and pressure in multiple locations simultaneously to increase the error-free processing of the commands. In another embodiment, tactile feedback is provided to the user upon compression of the sensor giving a confirmation of the successful completion of command input. Applications for the device of the present invention range from adaptable consumer products such as mobile phones, PDAs, portable audio and video players (such as Apple computer's popular iPod product line), and other portable electronic devices to industrial and robotics uses.

Two-dimensional (X,Y) reconfigurable input devices that measure the contact location on a display are commonly known. They comprise a contact matrix and detect the absence or presence of electrical signal in each cell of the matrix. Typically, these input devices are made clear such that they overlay a rigid output display. This configuration is excellent for use in large-sized screens where the display can show a large button that is not obstructed by the user's hand interacting with the input device.

However, for small, portable electronic devices, such as mobile phones and PDAs, the human finger is too large relative to the small-sized display. Because of this problem, many devices provide a small stylus to interact with the touch screen which takes more time to use, is difficult to handle, and is easily lost.

Another class of devices often used for input device is proximity sensors. These devices sense the presence of electrical conductive properties, such as found in a human fingertip, near the input device. However, they are susceptible to environmental changes and cannot work with non-conducting objects, such as a person wearing a glove. This class of devices does not measure contact pressure and therefore is not always able to interpret the intent of the user. Consequently, user interaction with these devices is limited.

Capacitance sensors have been known to be used as input devices, such as described in U.S. Pat. No. 4,736,191 by Matzke. This patent describes a touchpad made as a circular capacitance proximity sensor for use as a non-reconfigurable input device for a computer.

U.S. Pat. No. 5,463,388 by Boie describes a mouse or keyboard input device based on measuring capacitance changes due to the proximity effect of conductive and moist objects, such as the human hand, as an input device for computers.

U.S. Pat. No. 6,188,391 by Seely and U.S. Pat. No. 5,648,642 by Miller show another example of a two-layer capacitive touchpad made as a proximity sensor comprising conductive electrodes on opposite sides of a dielectric material. In a related patent, U.S. Pat. No. 5,841,078 by Miller, pressure sensing is discussed, but the approach shown is an indirect method of determining pressure based on the fingertip contact area increasing with increased pressure.

U.S. Pat. No. 6,888,536 by Westerman describes a sensor for simultaneously tracking multiple finger and palm contacts using an array of proximity sensors. This device is designed for handling multiple functions such as typing, cursor movement, and gesture recognition. The disclosed invention uses proximity sensors that require as many as 4 connections per sensor element and places the corresponding electronic circuit at the pixel level. Westerman describes the ability to measure both pressure and proximity effects, but fails to describe how the two effects can be decoupled.

Reconfigurable input devices based on an interchangeable keyboard and video display are also known in the art. U.S. Pat. No. 4,202,041 by Kaplow, for example, describes an input keyboard that dynamically changes the button appearance depending on the language and the functional requirements. Individual key buttons, however, are expensive to produce using conventional discrete electrical switches. U.S. Pat. Nos. 6,035,180 and 5,877,695 by Kubes describe an electroluminescent (EL) driver encased in the electronics of a mobile device that drives a matrix array to display various warnings, patterns, and images. These patents mention placing a touch input device below the EL display, but do not specify the details of the touch sensor.

U.S. Pat. No. 6,888,537 by Benson describes an input device that sends as an output signal the contact location (X,Y) along with the applied force (Z) in combination with a printed configuration sheet that allow the switch to operate in different applications. The description of this invention shows a foam-like compressible material designed to work as a compliant dielectric material, but in practice this foam cannot be made thin enough for use as an input device in small, portable electronic devices.

U.S. Pat. No. 6,824,321 by Ward describes a generic X,Y touch sensor combined with a multi-layered EL display to enable it to function in multiple modes. The EL display is placed behind the touch sensor, requiring the touch sensor to be essentially clear. The touch sensor, however, can be confused by multiple-point contacts and does not provide contact force information.

Finally, U.S. Pat. No. 5,479,528 by Speeter describes using a tactile sensor and IC (Integrated Circuit) to identify the size of a user to thereby reposition a virtual input device, such as a keyboard and mouse, to an optimal location.

The need therefore exists for a reconfigurable input device which provides simultaneous position and pressure information over the entire surface of the sensor so as to provide better flexibility in designing Control User Interfaces (CUI). The need also exists for an input device capable of detecting the distinct location and pressure of a touch in multiple locations so as to improve error-free processing of the user's commands.

SUMMARY OF THE INVENTION

In the following paragraphs, the terms "sensor" and "sensor array" refer to both arrays of individual sensing elements and a collection of one or more arbitrarily-placed sensing elements unless otherwise explicitly stated.

It is an object of the present invention to overcome drawbacks of the prior art by providing a novel reconfigurable input device based on a tactile sensor array, which is capable of measuring both the location and pressure of a touch at multiple locations and at the same time.

It is another object of the present invention to provide a standalone rigid or flexible tactile sensor incorporating a thin, compressible dielectric structure for separating electrode layers which may be used as a reconfigurable input device.

An additional object of the present invention is to provide a tactile sensor which may be integrated into an existing rigid or flexible circuit board design by incorporating an electrode layer into the circuit layout.

It is another object of the present invention to provide a tactile sensor covered by a flexible display means such as electroluminescent or organic LED lamps, for example.

It is a further object of the present invention to provide a reconfigurable tactile sensor input device controlled by a mixed-signal IC operating as either a master controller or as a slave peripheral.

It is another object of the present invention to provide a stand-alone tactile sensor array with homogeneous stiffness throughout the surface of a capacitance sensor, the sensor being mounted on a rigid substrate and covered by a flexible display means such as EL display for example.

It is a further object of the present invention to provide a reconfigurable tactile sensor input device controlled by a capacitance measuring mixed signal IC.

It is yet a further object of the present invention to provide a capacitance sensor adapted for use as a reconfigurable input device, the sensor incorporating a thin dielectric layer to separate one electrode layer from another.

Another yet object of the invention is to provide a reconfigurable input device with tactile feedback feature back to the user confirming the input command completion.

The present invention is based on a capacitance sensor of a novel design. To be of practical value for the consumer electronics market, the input device has to be inexpensive to produce and thin in size so as to fit in small, portable electronic devices such as mobile phones. To achieve this goal, a novel design for a dielectric separation layer is used between the first and the second electrode layers. This separation layer consists of a network of structures constructed from a compressible polymer material and which form a contiguous pocket of air between the shapes, which allows the structure to compress during use. This Compressible Dielectric Structure (CDS) is then deposited between the electrode layers. As opposed to more traditional foam sheets, which even in their thinnest forms are still relatively thick, this novel approach allows the CDS, and thus the entire sensor, to be extremely thin after construction. In some embodiments, the compressible dielectric structure is made to buckle under a certain threshold pressure to provide tactile feedback to the user.

Another extension beyond traditional tactile sensors is the mounting of a sensor on a rigid substrate. While traditional tactile sensors are made flexible and sensitive to pressure from both sides, the sensor of the invention can be made sensitive only from one side, the other side being set on a rigid surface of a substrate, either by bonding a thin tactile sensor to a rigid body or by using a rigid substrate to construct one of the electrode layers. Such a construction makes the invention much more effective as an input device while still accommodating designs requiring a flexible tactile sensor. This construction also allows for easy integration of a tactile sensor into a circuit, as a standard printed circuit board can be used to form the rigid substrate and electrodes.

A further innovation is adapting a mixed-signal (analog and digital) IC to be used as a controller for reconfigurable functions of the tactile sensor-based input device. Using a mixed-signal IC capable of measuring capacitance in combination with the thin, inexpensive tactile sensor allows the creation of an novel, economically-viable input device with a wide range of novel functions (including, but not limited to, pressure measurement as a third variable in addition to traditional X,Y location information) that may be quite useful in a number of industries including consumer electronics.

While the sensor described briefly above can function by itself as an input device with a separate display, a combination of such a sensor with an inexpensive, flexible display means mounted over the sensor makes it even more useful for small-sized consumer electronics applications, such as mobile phones and PDAs. For example, an electroluminescent (EL), e-ink or organic LED display mounted on top of the described sensor could display a unique control overlay to match the input mode configuration of the sensor.

BRIEF DESCRIPTION OF THE DRAWINGS

A more complete appreciation of the present invention and its various advantages can be gained through the following detailed description in which reference is made to the accompanying drawings.

DETAILED DESCRIPTION OF THE PREFERRED EMBODIMENTS OF THE INVENTION

A detailed description of the present invention follows with reference to accompanying drawings in which like elements are indicated by like reference letters and numerals.

Figure 1:
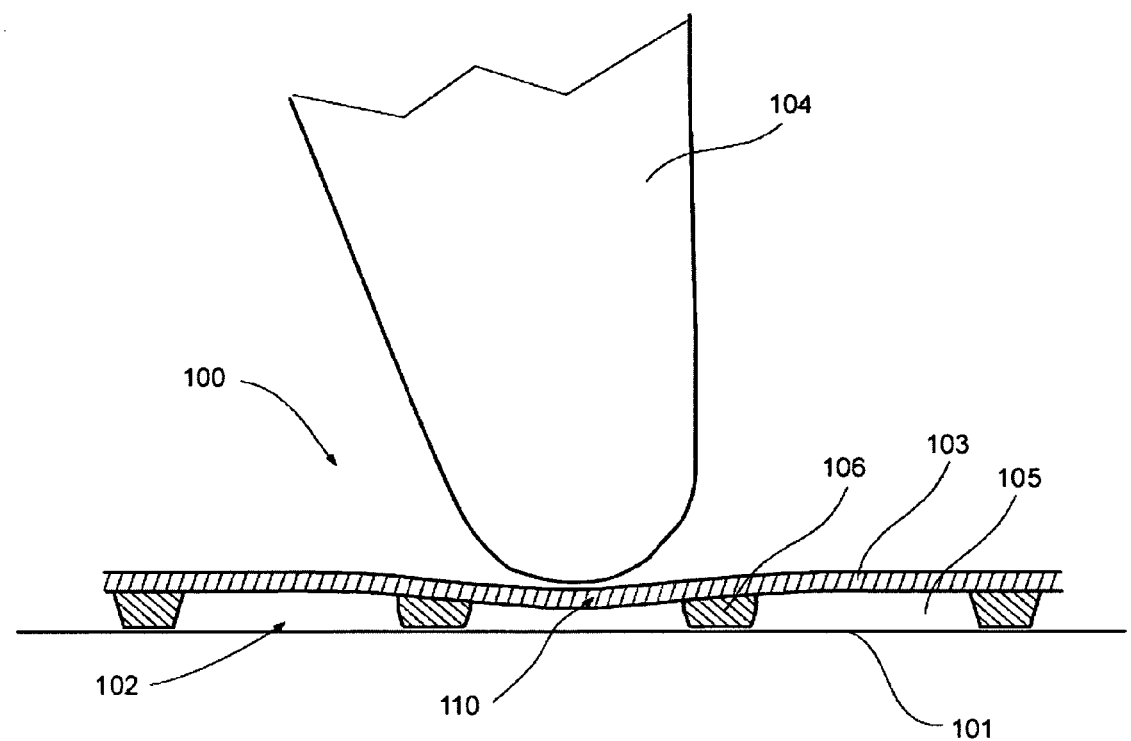
FIG. 1 is a general view of the most basic design of a tactile sensor of the invention with a stylus applying pressure on the sensor.

FIG. 1 shows the most basic configuration of the sensor device 100 of the present invention. All capacitance sensors have a first and a second electrode layer separated by a compressible dielectric structure. In this case, a first electrode layer 101 may be supported by a separate rigid substrate (not shown) or be made rigid in the first place. A second flexible electrode assembly 103 is suspended away from the first electrode layer 101 by the compressible dielectric structure 102 (electrical connection means for both electrode layers are not shown). The design of that layer is novel in that it is not made from a solid material such as traditional foam used in commonly known tactile sensors. While foam does incorporate compressible air pockets, a very thin sheet of foam looses its compressibility. In addition, it is very difficult to produce thin sheets of foam. The thinnest foam sheets available on the market have a thickness of about 0.031 inches, which is too thick for the purposes of the invention.

For small-sized consumer electronic devices such as mobile phones, it is important to have a means of separating the first electrode layer from the second electrode layer that is both reliable and simple to produce. According to the invention, this is accomplished by depositing a compressible dielectric structure of geometric elements such as strips, columns, polygons, curves, dots, etc. in a repetitive pattern over the entire surface of one electrode layer and leaving voids therebetween. The elements 106 shown in FIG. 1 in cross-section are made of compressible dielectric material such as silicone, rubber, or thermoplastic elastomer, etc. that is bonded to 101 with adhesive transfer tape or a thin layer of liquid adhesive. Importantly, after the sensor is assembled, voids 105 between elements of the separating structure naturally fill with air. Upon compression of the top surface of the second electrode layer 103 with a stylus 104 or any other object, the depression of the surface 103 is made through a combination of deforming the flexible electrode into the air void 105 and/or by compressing the solid portion of the separating structure 102. Structure elements 106 are closely positioned next to each other but with sufficient space so as to form compressible voids 105. The voids may be either vented to atmosphere or sealed but connected to each other. The thickness of such dielectric layer can be routinely made far less than the comparable thickness of the foam layer, and can reach 0.005 inches. In the most preferred configuration, the thickness ranges from about 0.05 mm to about 0.5 mm.

A further improvement in the design of a compressible dielectric structure is the ability to exhibit tactile feedback to the user. The elements of the structure can be made to buckle or collapse so as to give the user the sensation of a "click" or "snap" upon the compression of the sensor. That function is valuable to allow the user to have a tactile confirmation of a completion of the process of button activation. It is achieved by providing the geometric elements of the compressible dielectric structure with limited column strength or a built-in buckling means as described later.

Figure 8A:
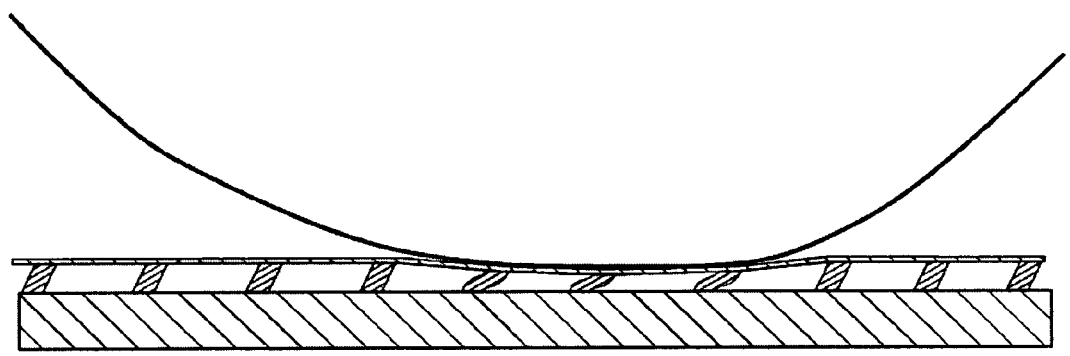
FIGS. 8A through C shows several possible designs of a compressible dielectric structure designed to buckle under pressure above a predetermined threshold to provide tactile feedback to the user.
Figure 8B:
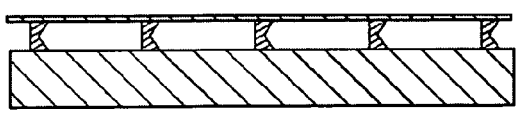
Figure 8C:
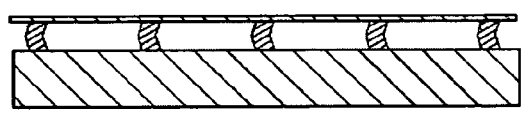

Attention is now drawn to FIGS. 8A through C showing examples of the buckling design of the compressible structure that provides tactile feedback. FIG. 8A shows that the strips of the structure are located at an angle and with greater height then width. This limits their column strength and encourages their collapse upon reaching a threshold pressure. Upon compression of the top surface by the user, the strips initially compress without collapse under light loads, but then collapse under higher load and the surface of the device buckles to one side after exceeding a predetermined threshold value. That value is easily adjustable by varying the properties of the material and the dimensions of the strips. Upon collapsing, the structure provides for instant movements of one surface closer to the other that can be used to provide a perception to the user that the button is fully compressed and no further compression is needed or useful.

Another alternative is shown on FIGS. 8B and C where the strips have one- or two-sided indentation so as to provide a predetermined point of collapse. Upon exceeding a threshold compression value, the strips collapse at this point again providing instant tactile feedback to the user to indicate that the compression of the input device is complete.

Other collapsible designs of the elements of the compressible dielectric structure are also contemplated and are included in the scope of this invention. They include a variety of buckling elements such as columns, dots, pyramids, etc. that are either incorporated with the basic elements of the structure or can possible be made as stand-alone elements.

In the first linear phase of use of this buckling structure, as the compression of the top surface is initiated and progressively increases, there is present a linear increase in the signal strength as the compressible structure is indented and the capacitance measurement value is used as an input signal. Upon reaching a threshold value, the second non-linear phase takes effect, when the dielectric structure collapses and a non-linear step-wise increase in signal takes place. Such dual phase use of a tactile sensor of the present invention having collapsible dielectric structure is yet another important novel feature of this input device.

The dielectric structures as described above are applicable to all the embodiments of the present invention.

Another feature of the present invention is an optional use of a ground layer (not shown) which may be incorporated with the design of an electrode layer. The purpose of such ground layer is to provide uniform surface over the entire surface of the tactile sensor.

Figure 2A:
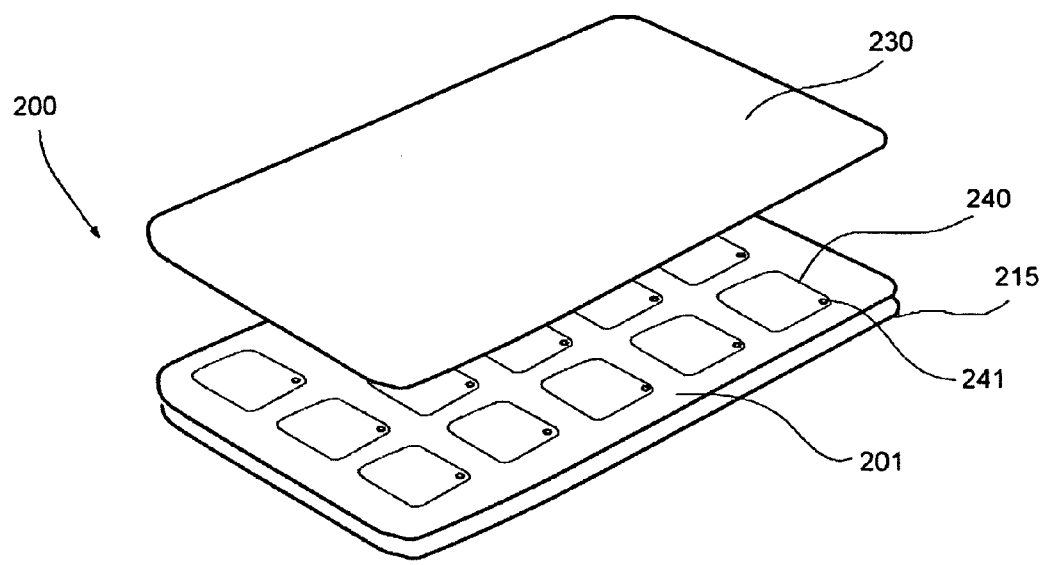
FIGS. 2A and 2B are elevated and side views with enlarged cutout of a first useful embodiment of the sensor of the invention having discrete electrodes for use as a reconfigurable keypad.
Figure 2B:
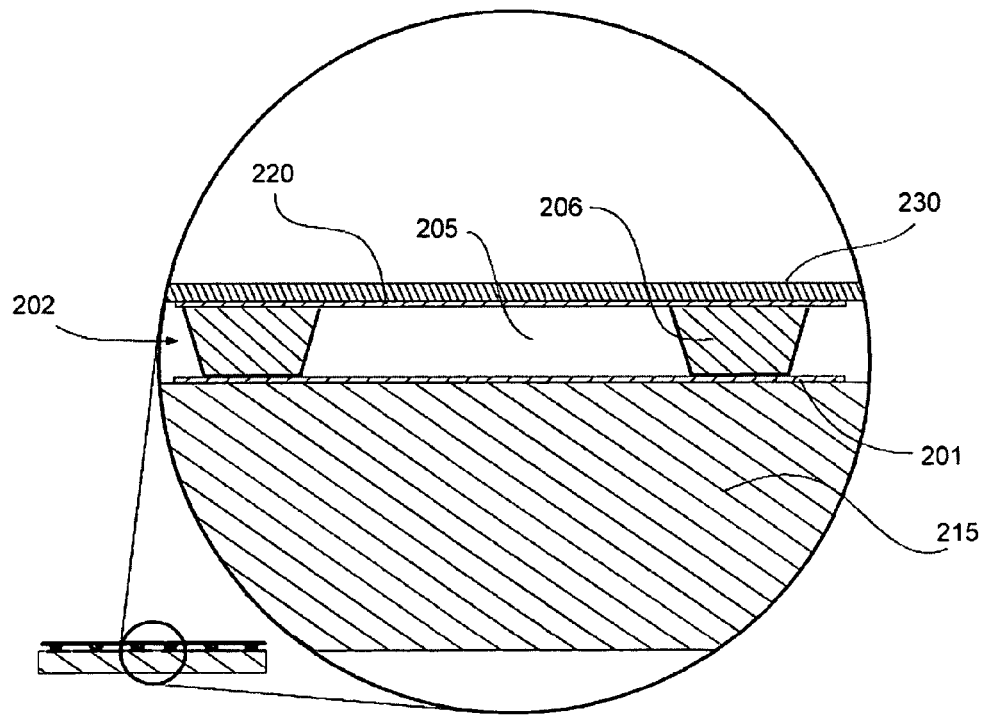

FIGS. 2A and 2B illustrate a first embodiment of a commercially useful design of the input device 200 of the present invention. It consists of a rigid substrate 215 onto which a first layer of electrodes 201 are mounted. The electrode layer 201 can be formed using any one of a variety of standard manufacturing methods, including PCB etching, sputtered or vacuum metal deposition, or conductive ink printing methods. In this case, the first layer of electrodes is a sensing layer having discrete "button"-type electrodes 240 spaced apart throughout the sensor and supplied with electrical connection means comprising individual electrical connections (not shown) attached to the electrodes at connection points 241.

Figure 7:
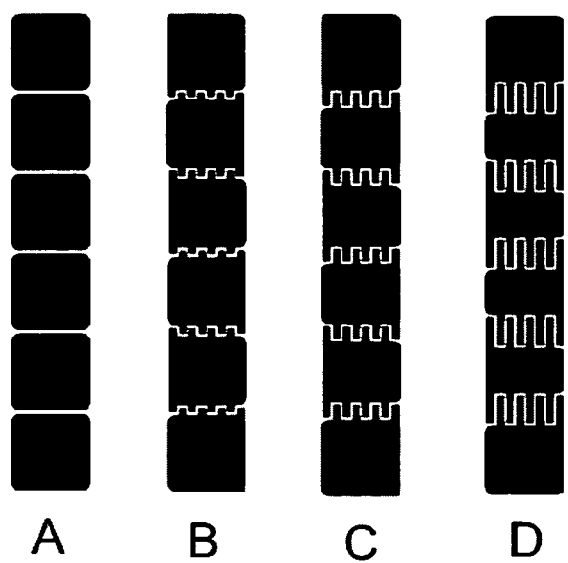
FIG. 7 shows various designed of overlapping electrodes adapted for better electrical coupling; and finally

To improve electrical coupling for scrolling and other similar functions, an optional interweaving overlap between electrodes can be implemented as shown in examples on FIG. 7. FIG. 7A shows electrode design without overlap. FIGS. 7B through D show an ever increasing degree of interweaving overlap between electrodes.

The compressible dielectric structure 202 is deposited over the first electrode layer in the same manner as described above and is comprised of solid compressible elements 206 with voids 205 therebetween. A solid conductive sheet 220 defining a second electrode layer is placed over the separating structure layer 202 and a protective dielectric membrane 230 covers the entire assembly to isolate the second conductive layer from the environment. As with the first electrode layer, the second layer can be produced via etching, deposition, or printing appropriate conductive and transparent materials. Alternatively, the electrode layers can be constructed from a flexible conductive material, such as a series of fine, conductive fibers woven into a cloth and cut to form the desired electrode pattern. Compressing the top layer 230 causes a local depression in the second electrode layer 220 that changes the capacitance of the corresponding "button electrode" 240 located under said depression.

The total number of conductive paths required to control such an arrangement equals the number of "button" electrodes of the first layer plus one path for the second electrode layer.

Reconfigurable keypads, remote controls, MP3 player controls, etc. are the most advantageous uses of this embodiment as the "button" electrodes can be reassigned various functions as applications shift.

Importantly, the compressibility of the entire surface of the sensor is uniform, as opposed to discrete buttons of the prior art that are made physically separate and are therefore not uniformly compressible. This is important for small-sized applications where the user's finger cannot always be placed perfectly over the center of the button. Compressing away from the button center of the prior art devices causes distortion in compression and mistakes in interpreting the intent of the user, since in conventional contact-type buttons the required contact between electrodes may be insufficient. The present invention is therefore superior to the prior art as it can be made to recognize the intent of the user with greater accuracy, as absolute contact between electrode layers is not needed for it to function properly.

An additional advantage of the present invention over the prior art is that the combination of measuring pressure and the contact location allows better recognition of the user's input. If the user compresses the area between the buttons, the area with the higher degree of compression may be given preference over the adjacent button electrode with a lower degree of compression. In that case, pushing down on the general area of the button and not exactly on the center of the button itself is sufficient to recognize the intent of the user.

This advantage can be developed further using interpolation of the contact location. Moving a stylus, for example, over or between two discrete buttons may be separately recognized by controlling software as a different command, such as scrolling. That additional functionality cannot be realized with conventional contact button electrodes and allows for a new range of functions within the same physical size. The same logic can be used in the case of moving contact location, such as when writing characters using a stylus, thus recognizing the direction of movement can be therefore recognized with a higher degree of accuracy.

Figure 3A:
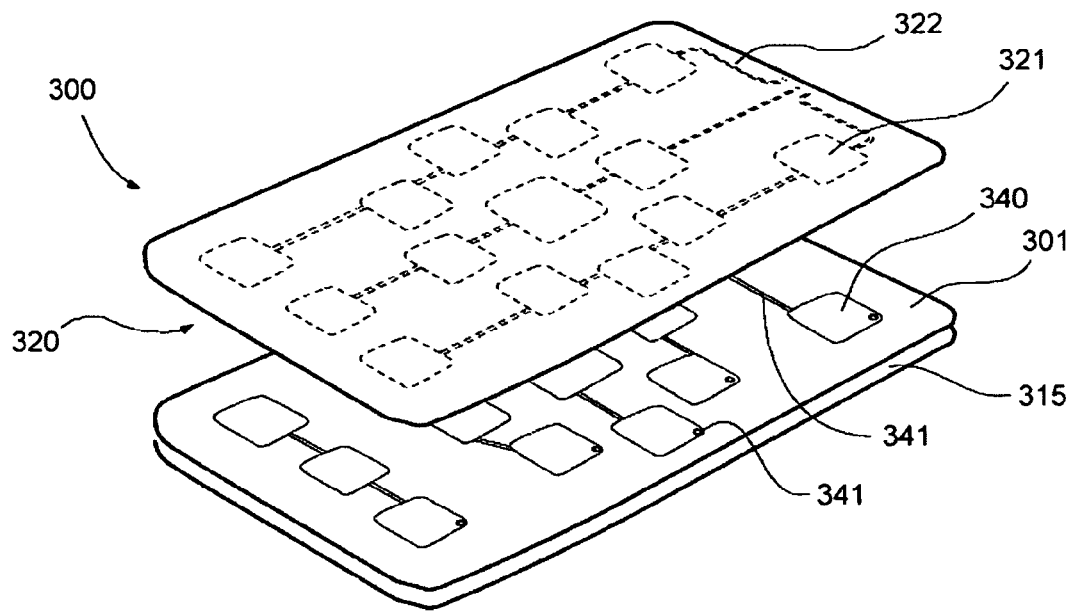
FIGS. 3A and 3B are elevated and side views with enlarged cutout of a second useful embodiment of the sensor of the invention incorporating a matrix of interconnected discrete electrodes.
Figure 3B:
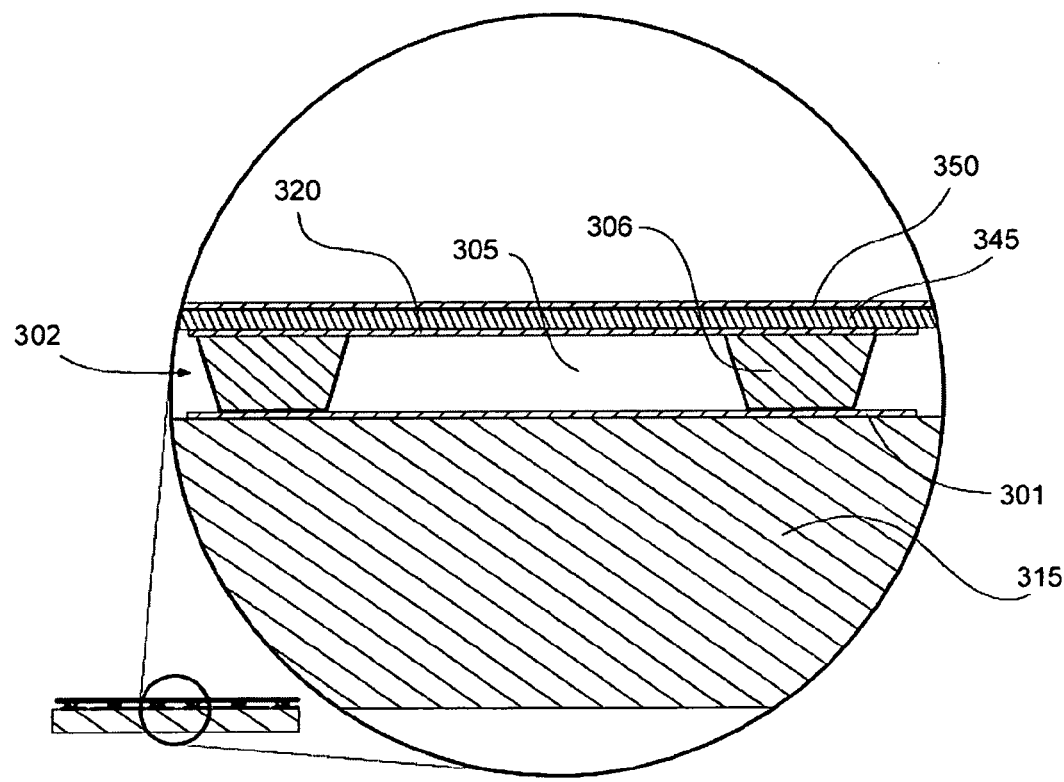

A second useful embodiment of the input device of the present invention is shown in FIGS. 3A and 3B. It is generally similar to the first embodiment in that the rigid substrate 315 houses a first layer of sensing electrodes 301 separated from the second layer 320 by a compressible dielectric structure 302 made with geometric elements 306 and voids 305. The "button" style electrodes 340 of the first electrode layer are generally interconnected in rows 341. Only electrodes at the end of each "row" have a dedicated electrical connection path 341 rather than all sensing electrodes as shown in the previous embodiment.

The second drive electrode layer 320 also contains individual discrete electrodes 321 arranged generally in columns in locations corresponding to the electrode locations of the first electrode layer. Buttons of the second layer have interconnecting electrical paths 322 along each "column." An additional dielectric membrane layer 345 is shown to cover the entire assembly and a separate ground layer 350 is deposited over the dielectric membrane to ground the entire sensor. Arrangement of the "columns" and "rows" of electrodes in the first sensing and second drive electrode layers allows the total number of electrical connections to be reduced. In the example shown on FIG. 3, the number of connections needed for the first electrode layer is 5 and for the second electrode layer, 3, thus making a total of just 8 electrical connections needed to control a 14-button input device. Although this embodiment shows the buttons in a pseudo matrix configuration, the invention allows them to be placed in nearly any arbitrary arrangement.

Figure 4:
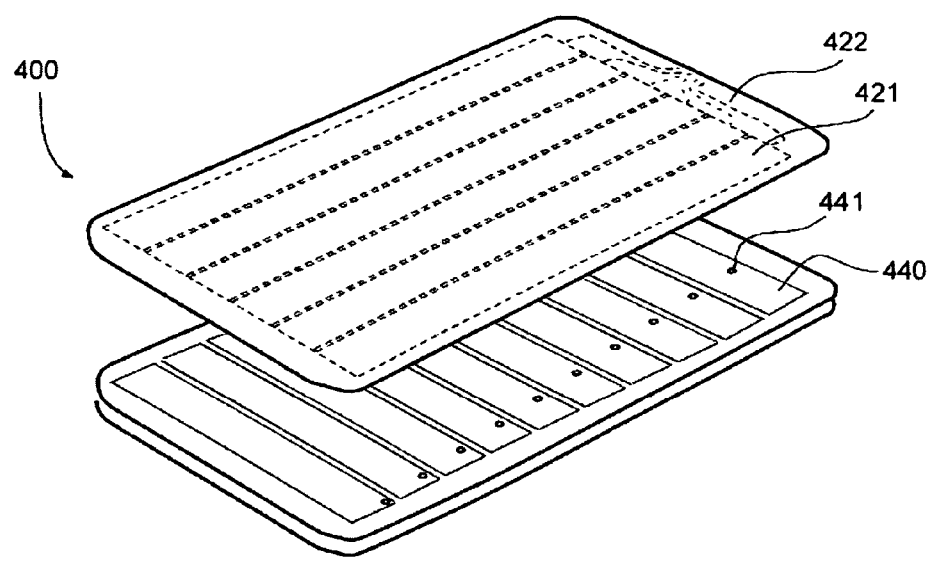
FIG. 4 shows an elevated view of the third embodiment of the invention in which the device contains a full matrix of electrodes.

A full matrix of electrodes is shown as a third embodiment of the invention on FIG. 4. Made using the same principles as the previous embodiments, this design 400 replaces discrete buttons with electrode strips 440 on the first sensing electrode layer. These strips are each equipped with an electrical connection point 441. Another set of electrode strips 421 is arranged on the second electrode layer in a direction perpendicular to the sensing electrode strips. Each upper electrode strip is also equipped with an electrical connection 422. A full electrode matrix is therefore arranged with the total number of wires needed to control the matrix being the sum of horizontal and vertical strips. In the example of the device shown on FIGS. 4, the total number of control wires is 10 for the bottom layer plus 6 for the top, totaling 16 for a 10×6 sensor array. The high spatial resolution of this matrix formed by the intersection of 421 and 440 provides for a virtually unlimited number of input device configurations in a manner similar to how conventional TFT matrix displays are able to show multitudes of images. "Buttons," "sliders," and other controls now exist as input concepts rather than discrete, physical forms and can be easily programmed via controlling software.

Figure 5:
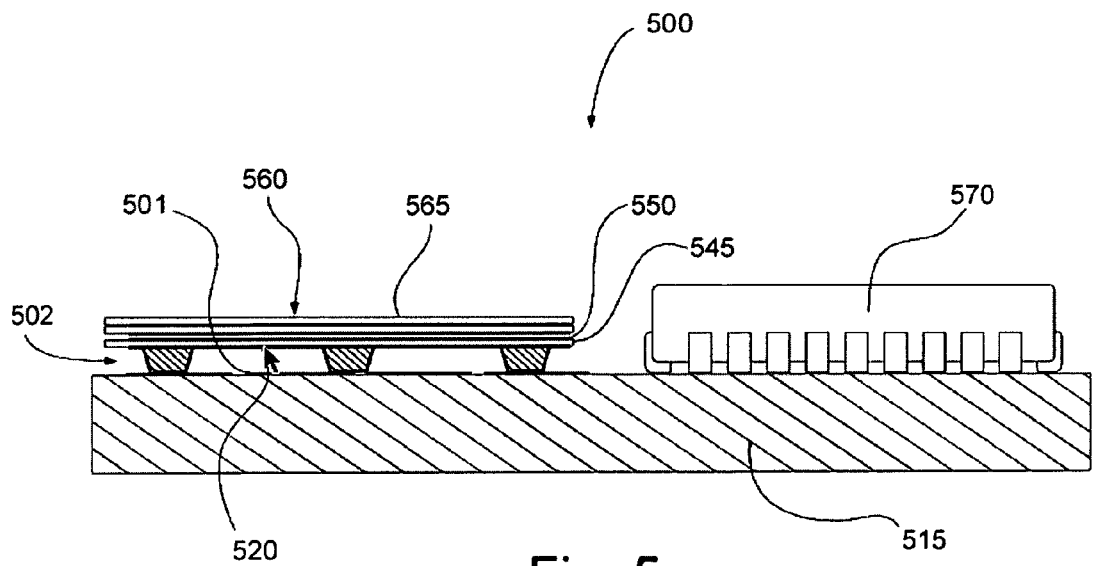
FIG. 5 shows a side view of a fourth embodiment of the invention showing a flexible display means over the sensor and an IC mounted nearby; and finally

A fourth embodiment of the input device of the present invention is shown on FIG. 5. It has two further improvements in comparison with the previous versions: an IC 570 adapted to measure the sensor pressure values and optionally mounted nearby on the same substrate 515 as the sensor, and a flexible display means 560 overlaying the basic sensor.

The use of a commercially-available IC mounted together with the sensor allows for the mass production of the input device of the invention at an economical price. To be most useful for the purposes of the invention, the IC should be mixed-signal, allowing for both analog and digital input and output, and be capable of measuring capacitance over the entire range of electrodes, be they buttons, sliders, electrode matrices, etc. By incorporating a proprietary or standard digital interface, the IC would allow the sensor to act as a peripheral device to a host processor. This interface could take the form of any of a number of standard digital serial protocols such as $I^2C$, SPI, cambus, RS-232, USB, or provide memory-mapped I/O via a parallel interface port. An application specific, proprietary protocol could be used as well. The IC device should also be capable of repeated capacitance measurements at a pace fast enough to detect user input and respond appropriately in real-time. Preferably, all local analog signal processing and basic control is also done at the IC level so that only user commands appropriate for the current configuration are sent outside as an output signal. For example, rather than providing the raw pressure level at each element, the IC could specify a precise, interpolated, X, Y location and pressure at each point of contact. Alternatively, more sophisticated processing could enable more logical commands, such as "GAME CONTROLLER: FIRE," or "AUDIO PLAYER: SELECT." Further, a mixed-signal IC featuring an embedded microcontroller would allow a single chip to handle both input processing from the reconfigurable tactile input device as well as managing the overall device functionality without the need for a host. A custom ASIC could also be developed incorporating any or all of the above features to tailor the sensor for a specific application.

As an example of a commercially-available component, Cypress Semiconductor (San Jose, Calif.) produces a commercially-available line of ICs capable of performing the capacitive sensing and digital interfacing as described above. This technology, known under the trade name "CapSense" within Cypress's Programmable System-on-Chip (PSoC) line, is sufficient for tactile sensors with relatively large sensing elements of about 25 $mm^2$ or greater in area. Analog Devices (Norwood, Mass.) also produces a line of commercially-available ICs capable of capacitance measurement with smaller sensors, but they can only operate as slave peripheral devices and cannot read as many sensors.

Figure 6:
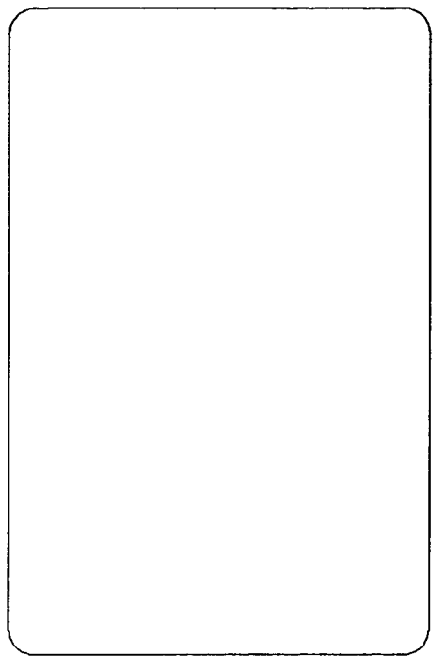
FIGS. 6A through 6D show elevation views of various lit patterns of a multi-segment flexible display means indicating various modes of operation for a reconfigurable input device.
Figure 6:
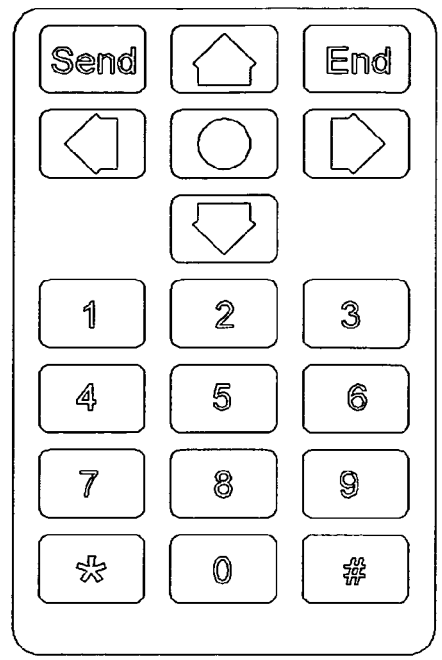
Figure 6:
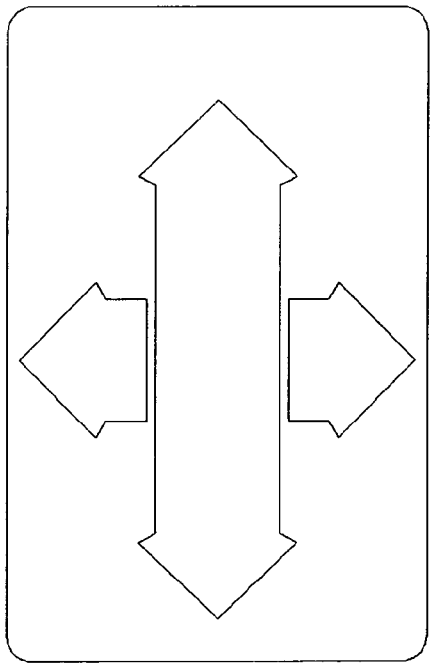
Figure 6:
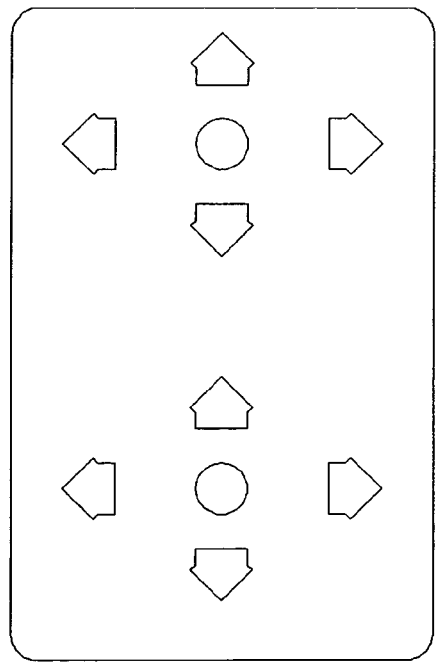

In FIG. 5, the sensor 500 is comprised in part of the rigid substrate 515 supporting the first layer of electrodes 501, which can be made using any of the variations described above. The compressible dielectric structure 502 supports the second layer of electrodes and may also be made using any of the schemes described above. In this configuration, although shown with a compressible dielectric structure, the dielectric layer between electrodes can be made from foam or using other traditional methods, as the novel distinction is not only in the sensor design but also in the use of a flexible display means 560 located over the sensor elements and including an optional dielectric membrane 545 and ground shield 550. The flexible display means 560 may be configured to show different functional modes as shown in FIG. 6. and maybe be covered by a transparent protective layer 565.

The flexible display means 560 is designed to indicate the current configuration of the reconfigurable tactile input device of the invention. In some cases, a complete overlay is not needed, and a display may only cover a portion of the sensor to indicate dots, cross-hairs, arrows, or similar indicia, which may in turn indicate the current function to the user. The flexible display means also has to be soft enough to transmit the user's compressive pressure to the sensor layers. One useful technology that can be used advantageously for the purposes of the invention as a flexible display means is known as electro-luminescent (EL) displays. EL displays can be designed to change configurations depending on the mode of operation and provide guidance to the user as to which mode is currently employed.

An electro-luminescent display is electrically similar to a capacitor, consisting of two conducting surfaces, separated by a dielectric layer and a selectively-deposited light-emitting phosphor which illuminates when subjected to an electric field. An AC voltage is typically used to generate the electric field across the phosphor and dielectric layers. Twice during each cycle electrons are excited and the phosphor emits light through the transparent front electrode. The advantage of the EL display as used in this invention is its small thickness and flexibility allowing it to cover the sensor without reducing the tactile sensing function. EL displays are also readily available and will not significantly burden the cost of the entire device.

A specific example of an EL display that can be used for the purposes of the present invention is that made by PELIKON LIMITED, Cambridge, UK. Other flexible display means can also be used such as Organic LED displays or "electronic ink" such as produced by E-INK, Cambridge, Mass. and "electronic paper" produced by Sipix Imaging, Fremont, Calif.

FIG. 6 shows various useful examples of sensor configurations that can be made using multi-segmented EL display. FIGS. 6A through 6D illustrate the illuminated appearance of the display during different operating modes: "freeform" mode 6A, in which the sensor can be used as a touch pad or a writing tablet; "phone" mode 6B, where the sensor operates as a standard keypad; "navigation" mode shown on FIG. 6C, such as when scrolling a list or operating an audio player; and "game" mode 6D, where the sensor provides typical controls for most portable gaming systems.

In a typical arrangement, the bottom electrode layer of the EL display will be a ground layer that may optionally be combined with the top ground layer for the sensor. The entire device is then optionally covered by a translucent flexible cover to protect the assembly from abrasion, moisture and other adverse environmental conditions.

FIGS. 7*a*-7*d* shows various electrode configurations where coupling between elements is desired as in sliding controllers. The RTID inherently provides coupling between discrete electrodes due to both electrical and mechanical coupling effects. For operations that require centroid detection, fine pitch electrodes can be used or additional coupling between elements can be incorporated by sensor design. For example, if a very thick rigid overlay material is used, the response from all electrodes would be the same if the operator pressed at the center of the electrode. This mechanical coupling approach has the disadvantage of increasing the thickness of the RTID. Consequently, for electrodes that act as slider or scroll wheel, the electrode design can incorporate fingers that intertwine one another. The degree of electrical coupling can be adjusted depending on the sensor size and desired operational behavior.

FIGS. 8*a*-8*c* shows various dielectric support structures that are designed to buckle under heavy pressure. FIG. 8*a* shows one preferred embodiment where the contact region has buckled under load. For scrolling or navigating modes, light pressure is used such that buckling does not occur, but the tactile sensor is able to determine the contact location and direction of motion. When the operator has reached the desired location, he or she can press harder at that location to indicate selection. With this harder press, the support structures buckle or collapse. This result in higher capacitance measurement, due to the electrode gaps being closer, and the force supported by a collapsed structure is lower such that tactile sensation that the user has pushed or selected the desired selection is provided to the user.

The reconfigurable tactile input device of the present invention has the following advantages over the existing input devices of the prior art:

It provides simultaneous position and pressure information over the entire sensor surface, thus providing more flexibility in User Interface design;

Pressure information can easily prevent accidental control adjustment when compared to existing touch sensors, which can require an additional mechanical switch to enable and disable control inputs (Apple computer's iPod, for example, has such a hold switch.);

With the tactile input device of this invention, separate switches are not necessary as different pressure levels can be used within the same area to indicate different actions, such as scrolling movement or selecting a desired object;

Position error drift is minimized, as no position calibration, such as is needed for touch screens, is required;

The invention has the inherent ability to resolve more than one contact location, which provides a more robust understanding of user intent in comparison with single-contact output devices; and finally It works using fingers, as well as a great number of conductive and non-conductive objects.

Although the invention herein has been described with respect to particular embodiments, it is understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A reconfigurable tactile input device comprising:
a first electrode layer having a first electrical connection means,
a flexible second electrode layer having a second electrical connection means,
at least one of the first or second electrode layers comprising more than one electrode,
a compressible dielectric structure separating said first electrode layer from said second electrode layer, said structure comprising a plurality of geometric elements made of compressible dielectric material forming voids therebetween, said plurality of geometric elements located beneath at least one electrode of said second flexible electrode layer, and
a control means connected to said first and said second electrical connection means and adapted to measure capacitance in real time between electrodes of said first and said second electrode layers, whereby when a change in capacitance of at least one of said electrodes is detected, it is measured and converted by said control means into contact position and force of compression over said input device, which is then transformed into a recognized user input command signal based on a current input device configuration; said configuration being reconfigurable through said control means.

2. The input device as in claim 1, wherein said first or said second layer of electrodes comprising a plurality of discrete "button"-type electrodes, each of said electrodes supplied with individual electrical connection point, said adjacent "button"-type electrodes have an interweaving overlap therebetween whereby adjacent electrodes are shaped to have protrusions extending into a space therebetween in an alternating manner to allow mechanical coupling as in a slider control.

3. The input device as in claim 1, wherein said first layer of electrodes comprising a first plurality of discrete "button"-type electrodes, said second layer of electrodes comprising a second plurality of discrete "button"-type electrodes said first plurality of "button"-type electrodes are generally arranged in rows via a first series of interconnecting electrical paths customized to a specific user interface and functional configuration said second plurality of "button"-type electrodes are generally arranged in columns via a second series of interconnecting electrical paths also customized to said specific user interface and functional configuration, said rows of the first layer overlapping said columns of the second layer over said compressible dielectric structure separating said rows from said columns.

4. The input device as in claim 1, wherein said first electrode layer comprising first individual electrodes made as parallel strips, said second electrode layer comprising second individual electrodes made as parallel strips oriented generally perpendicular to the first electrodes and overlapping thereof over said compressible dielectric structure, thereby forming a capacitance measuring matrix of electrodes.

5. The input device as in claim 1, wherein said electrodes are made from metal or conductive organic material and having an electrode pattern produced using a method selected from a group consisting of etching, sputtering, vapor deposition, application of ink suspension, indium tin-oxide, or providing a cloth made of conductive fibers and cut into desired shape.

6. A reconfigurable tactile input device comprising:
a first electrode layer having a first electrical connection means,
a flexible second electrode layer having a second electrical connection means, at least one of the first or second electrode layers comprising more than one electrodes,
a compressible dielectric structure separating said first electrode layer from said second electrode layer, said structure comprising a plurality of geometric elements made of compressible dielectric material forming voids therebetween, said plurality of geometric elements located beneath at least one electrode of said second flexible electrode layer, and
a control means connected to said first and said second electrical connection means and adapted to measure capacitance in real time between electrodes of said first and said second electrode layers,
whereby when a change in capacitance of at least one of said electrodes is detected, it is measured and converted by said control means into contact position and force of compression over said input device.

7. The input device as in claim 6, wherein said plurality of geometric elements of said dielectric structure are arranged in repeating patterns, whereby said input device having uniform compressibility over at least a portion of the device.

8. The input device as in claim 6, wherein said voids are vented to atmosphere.

9. The input device as in claim 6 wherein said voids are sealed and connected to each other.

10. The input device as in claim 6, wherein said geometric elements of said compressible dielectric structure are selected from the group consisting of strips, columns, curves, polygons, or dots.

11. The input device as in claim 6, wherein said compressible dielectric structure is made from an elastic material.

12. The input device as in claim 6, wherein said geometric elements of said compressible dielectric structure have a predetermined column strength, whereby they collapse upon applying pressure onto said device at any place over its entire surface when such pressure exceeding a predetermined threshold value to provide tactile feedback to a user.

13. The input device as in claim 6, wherein said geometric elements of said compressible dielectric structure exhibit a first linear phase of compression followed by a second non-linear phase of compression once that compression at any place over its entire surface exceeds a predetermined threshold value.

14. The input device as in claim 6, wherein said geometric elements of said compressible structure include an indentation defining a point of collapse once compression applied to said device at any place over its entire surface exceeds a predetermined threshold value.

15. A reconfigurable tactile input device comprising:
a first electrode layer having a first electrical connection means,
a flexible second electrode layer having a second electrical connection means,
at least one of the first or second electrode layers comprising more than one electrode,
a compressible dielectric structure separating said first electrode layer from said second electrode layer, said structure comprising a plurality of geometric elements made of compressible dielectric material forming voids therebetween, said plurality of geometric elements located beneath at least one electrode of said second flexible electrode layer, and
a control means connected to said first and said second electrical connection means, said control means including an IC mounted in the vicinity of said electrode layers adapted to measure capacitance in real time between electrodes of said first and said second electrode layers,
whereby when a change in capacitance of at least one of said electrodes is detected, it is measured and converted by said control means into contact position and force of compression over said input device.

16. The input device as in claim 15, wherein said IC is adapted to perform as a slave peripheral to conduct signal conditioning, filtering, bias compensation as well as position and force calculations with a digital interface.

17. The input device as in claim 15, wherein said IC further comprising a reprogrammable microcontroller adapted to perform either as a primary controller for said input device or as a slave peripheral with a digital interface.

18. The device as in claim 17, wherein said IC is an ASIC of a mixed-signal type adapted to measure capacitance in real time between electrodes of said first and said second electrode layers and perform signal processing functions including calculations of contact centroid location, force, and trajectory, said functions further including digital filtering for noise reduction and erroneous contact discrimination.

19. A reconfigurable tactile input device comprising:
   a first electrode layer,
   a flexible second electrode layer,
   at least one of the first or second electrode layers comprising more than one electrode,
   a compressible dielectric structure separating said first electrode layer from said second electrode layer, said structure comprising a plurality of geometric elements made of compressible dielectric material forming voids therebetween, said plurality of geometric elements located beneath at least one electrode of said second flexible electrode layer,
   a flexible display mounted over at least a portion of said second electrode layer, and
   a control means connected to said first electrode layer, said second electrode layer, and said flexible display, said control means adapted to change the configuration of said flexible display to correspond to the change in operational mode configuration of said input device.

20. The input device as in claim 19, wherein configurations of said flexible display correspond to configurations of electrodes for said first and said second electrode layers.

21. The input device as in claim 19, wherein configurations of said flexible display correspond to operational modes but do not correspond to the physical layout of the electrodes.

22. The input device as in claim 19, wherein said flexible display is an electroluminescent display.

23. The input device as in claim 19, wherein said flexible display is an organic LED display.

24. The input device as in claim 19, wherein said flexible display is an "electronic ink" display.

25. The input device as in claim 19, wherein said flexible display is a multi-segmented display.

26. The input device as in claim 19, wherein said flexible display is an active matrix display.

27. The device as in claim 26, wherein said active matrix display is a Thin Film Transistor TFT Matrix display.

28. The input device as in claim 19, wherein said display is adapted to provide at least two different modes of operation.

29. The input device as in claim 28, wherein said modes of operation are selected from the group consisting of a "free-form" mode, a "phone" mode, a "navigation" mode, and a "game" mode.

30. The input device as in claim 19 further including separate control means for changing the flexible display configuration and reading the sensor input.

* * * * *